United States Patent
Heikkonen et al.

(10) Patent No.: US 9,613,168 B2
(45) Date of Patent: Apr. 4, 2017

(54) COMPUTER AIDED MODELING

(71) Applicant: TEKLA CORPORATION, Espoo (FI)

(72) Inventors: Teemu Heikkonen, Espoo (FI); Mikko Huovila, Espoo (FI); Vesa Pirilä, Espoo (FI); Teemu Rantanen, Espoo (FI); Ragnar Wessman, Espoo (FI)

(73) Assignee: TEKLA CORPORATION, Espoo (FI)

( * ) Notice: Subject to any disclaimer, the term of this patent is extended or adjusted under 35 U.S.C. 154(b) by 659 days.

(21) Appl. No.: 13/732,540

(22) Filed: Jan. 2, 2013

(65) Prior Publication Data

US 2013/0173229 A1 Jul. 4, 2013

Related U.S. Application Data

(60) Provisional application No. 61/600,857, filed on Feb. 20, 2012.

(30) Foreign Application Priority Data

Jan. 2, 2012 (FI) .................................... 20125002

(51) Int. Cl.
G06F 17/50 (2006.01)
(52) U.S. Cl.
CPC .......... *G06F 17/5009* (2013.01); *G06F 17/50* (2013.01)
(58) Field of Classification Search
CPC .............................. G06F 17/5009; G06F 17/50
USPC ........................................................ 703/1, 6
See application file for complete search history.

(56) References Cited

U.S. PATENT DOCUMENTS

| 5,201,047 | A | * | 4/1993 | Maki | G06F 17/30598 |
|---|---|---|---|---|---|
| 6,505,186 | B1 | | 1/2003 | Muro et al. | |
| 7,032,003 | B1 | * | 4/2006 | Shi | H04W 99/00 |
| | | | | | 707/999.01 |
| 7,639,868 | B1 | * | 12/2009 | Regli | G06N 99/005 |
| | | | | | 382/159 |
| 2003/0023611 | A1 | * | 1/2003 | Benjamin | G06Q 10/10 |
| 2004/0103103 | A1 | | 5/2004 | Kalthoff et al. | |
| 2004/0267695 | A1 | * | 12/2004 | Alho et al. | 707/1 |

(Continued)

FOREIGN PATENT DOCUMENTS

| EP | 1638018 A2 | 3/2006 |
|---|---|---|
| EP | 1653353 A1 | 5/2006 |
| WO | 0104794 A1 | 1/2001 |

OTHER PUBLICATIONS

Agnes Knopp-Trendafilova, "Link between a structural building information model and classification systems in construction," 2010, Aalto University, 94 pages.*

(Continued)

*Primary Examiner* — Kamini S Shah
*Assistant Examiner* — Russ Guill
(74) *Attorney, Agent, or Firm* — Barnes & Thornburg LLP

(57) ABSTRACT

A solution is introduced in which, instead of providing an object with all information, some of the information is provided by means of one or more group definitions. This is achieved by performing a grouping operation during which an object having object data defining at least one property of the object is assigned to a group having at least one group definition defining at least one feature shared by objects assigned to the group; and storing as mapping information a grouping time indicating the time the grouping operation was performed to the object and a link between the object and the group.

24 Claims, 4 Drawing Sheets

(56) References Cited

U.S. PATENT DOCUMENTS

| | | | |
|---|---|---|---|
| 2006/0004841 A1* | 1/2006 | Heikkonen et al. | 707/102 |
| 2006/0080300 A1* | 4/2006 | Gruenwald | G06F 17/30392 |
| 2006/0136398 A1 | 6/2006 | Suomi et al. | |
| 2007/0150433 A1 | 6/2007 | Chen | |
| 2009/0313223 A1 | 12/2009 | Rantanen | |
| 2010/0082534 A1 | 4/2010 | Sagar et al. | |
| 2011/0107301 A1* | 5/2011 | Chan | G06F 17/2288 717/121 |
| 2011/0208695 A1* | 8/2011 | Anand | G06F 17/30578 707/610 |
| 2011/0246155 A1* | 10/2011 | Fitch et al. | 703/6 |

OTHER PUBLICATIONS

Philip Teale et al., "Data Patterns," 2003, Microsoft Corporation, 196 pages.*

Search Report for Finnish Patent Application No. 20125002; Nov. 5, 2012.

Finnish Search Report for Finnish Patent No. 20125002, dated May 14, 2013.

Finnish Office Action for Finnish Patent No. 20125002, dated Apr. 15, 2015.

* cited by examiner

COMPUTER AIDED MODELING

RELATED APPLICATIONS

This application claims priority to Finnish Patent Application No. 20125002, filed on Jan. 2, 2012, and claims benefit from U.S. Provisional Patent Application No. 61/600,857, filed on Feb. 20, 2012, the contents of each of which are hereby incorporated herein by reference in their entirety.

FIELD

The invention relates to data processing, and especially to computer-aided modeling.

BACKGROUND

The development of data processing systems, computers and computer applications has transformed different processes into computerized processes. One example of such a process is modeling. Modeling means that a model is created from a product under design for describing the product to be constructed, the model containing at least information needed to illustrate the product. A product may comprise one or more articles. Computer applications typically apply predefined object types that are provided with values in connection with the modeling to create objects (models) of articles that exist or will exist (or at least are planned to exist) in the real world. Examples of these object types in the field of building modeling include beams, columns, plates and reinforcement. A product model may comprise in principle an unlimited amount of objects, some of the objects being similar ones, i.e. replaceable with each other. To facilitate manufacturing, or work at a construction site, for example, the objects or some of the objects undergo a process called numbering. During the numbering process, the objects are provided with "labels" so that objects having the same label are similar ones. A label identifies the object accurately enough. For example, four objects, each representing a column for a building, the columns differing from each other only on their location in the building, can be identified with one label. It is much easier in the construction site to take a column with the label amongst columns transferred to the construction site and erect the column compared to a situation when each column would have a unique identifier. However, if one of the columns has different outer dimensions, it must have a different label than the others, since it is not replaceable with the others. The evolution of modeling to a multi-user modeling with shared data in a server, not only in real-time but also offline, creates challenges for the numbering, or to any corresponding grouping operation, especially if one target is to ensure that objects that are not replaceable with each other do not belong to the same group and have the same label, for example.

SUMMARY

The invention relates to a method, an apparatus and a computer program product which are characterized by what is stated in the independent claims. The preferred embodiments are disclosed in the dependent claims.

An aspect provides a solution in which, instead of providing an object with all information, some of the information is provided by means of one or more group definitions. When the object is assigned to a group, a time when the assignment is performed, is stored to be used later for checking whether the object assignment for the group has remained valid.

BRIEF DESCRIPTION OF THE DRAWINGS

In the following different embodiments will be described in greater detail with reference to the attached drawings, in which.

DETAILED DESCRIPTION OF SOME EMBODIMENTS

Exemplary embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

The present invention is applicable to any computer implemented application, any computing apparatus and corresponding component(s) configured to support computer-aided modeling, especially to any application supporting use of shared data, any computing apparatus and corresponding component(s) configured to access and update/change shared data stored to a shared data repository (memory), in any data storage system or any combination of different data storage systems, such as data repositories (memories) in a client—server structure without restricting the invention to such solutions. Examples of such computer implemented applications include applications for building information modelling, applications for project cooperation, applications for construction management and/or detailing (steel detailing, precast concrete detailing, etc.) and/or for engineering, applications for infrastructure design and construction, applications for infrastructure and energy industries, such as applications for distribution network monitoring and operations support, applications for energy and water utilities' business operations, applications for municipalities' technical activities, without restricting the invention to such applications. The methods and processes used by the computing apparatuses, by different data managing systems, including file systems, and data repositories, are developing. Such development may require extra changes to an embodiment. Therefore, all words and expressions should be interpreted broadly and they are intended to illustrate, not to restrict, the embodiment.

Figure 1:
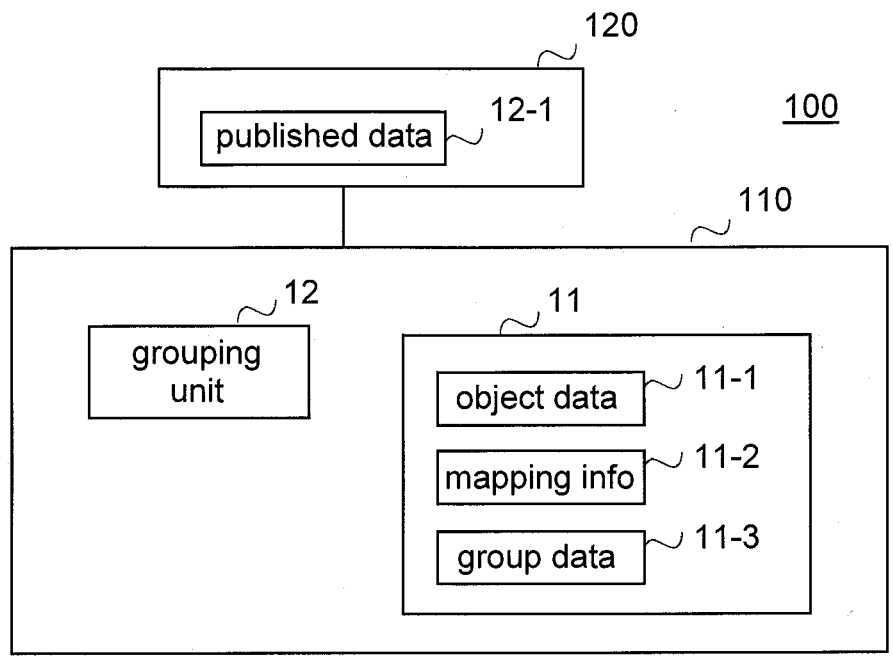
FIG. 1 is a simplified block diagram illustrating a system used as an example.

A general architecture according to an embodiment is illustrated in FIG. 1. FIG. 1 is a highly simplified system architecture only showing some elements and functional entities, all being logical units whose implementation may differ from what is shown. The connections shown in FIG. 1 are examples of logical connections; the actual physical connections may be different. It is apparent to a person skilled in the art that the systems also comprise other functions, structures and apparatuses. It should be appreciated that the functions, structures, elements and the protocols used in or for data accessing, updating and management are irrelevant to the actual invention. Therefore, they need not to be discussed in more detail here.

The system 100 illustrated in FIG. 1 comprises one or more apparatuses 110 (only one shown in FIG. 1), connected to a server 120 (or to a server system). The connection may be over a network, such as a mobile network, a public switched telephone network, a wide area network WAN, Internet, a local area network LAN open for all users or with restricted access (an enterprise LAN or office LAN, for example), or a private network. Yet a further example is a computer forming a "system" for internal clients, such as applications and application instances, in which case an internal bus, like a memory bus, acts as a "network".

In the embodiment of FIG. 1, the server 120 is a mere a data repository 12-1 for model data not performing other data processing than storing and data retrieving. The data repository may be an external data repository shared and thereby accessible by apparatuses 110 having proper access rights, and/or the data repository may be an internal memory of a computing apparatus shared by different applications or different application instances. The data repository 12-1 may be managed by a file management system or a database management system, for example. The data repository 12-1 may be any kind of conventional or future data repository, including distributed and centralized storing of data, managed by any suitable management system. An example of a distributed storing includes a cloud storage in a cloud environment (which may be a public cloud, a community cloud, a private cloud, or a hybrid cloud, for example). The implementation of the data repository and the way how the shared data is stored and updated bears no significance to the invention, and need not to be described in detail here. In the exemplary system, data are stored to the repository in a file, for instance.

The apparatus 110 is a computing device comprising not only prior art means, but also means for implementing functionality described with an embodiment/example and it may comprise separate means for each separate function, or means may be configured to perform two or more functions, and even to combine functions of different embodiments/examples. These means may be implemented by various techniques. For example, the means may be implemented in hardware (one or more apparatuses), firmware (one or more apparatuses), or software (one or more modules) components (recorded indelibly on a medium such as read-only-memory or embodied in hard-wired computer circuitry), or combinations thereof. For a firmware or software, implementation can be through units/modules (e.g., procedures, functions, and so on) that perform the functions described herein. For this purpose, the apparatus 110 illustrated in FIG. 1 comprises one or more data storages 11 (only one shown in FIG. 1) and a grouping unit 12. The computing apparatus 110 may be any apparatus with which the model may be created and/or edited and/or viewed and/or undergo a grouping operation. Examples of apparatuses include a work station, such as a laptop, a smartphone, a personal computer, a tablet computer, a field device, e-reading device, a smart phone, or a personal digital assistant (PDA).

The one or more data storages 11 comprise data relating to a model and stored/to be stored during modeling, for example. In the example illustrated in FIG. 1 the data storage 11 comprises three different data structures: a data structure "object data" 11-1 for object definitions, a data structure "mapping information" 11-2 for associating the object to an assigned group, as will be described below, and a data structure "group data" 11-3 for group definitions. A data structure may be implemented as a table or as a structured file, for example.

The object data 11-1 comprises for each object an object identifier, at least those object definitions that are used to determine whether the object is replaceable (similar) with another object, and a change time. An object definition defines one or more properties of an object. A property may be a physical property or a logical property, and the property is expressed so that it can be compared with another property. The object data may further comprise, either as an object definition or as additional information, object-specifically information on the location and/or the position of the object. The object definitions of an object representing a real world article define directly or undirectly at least the physical properties of the object, such as its geometry and material. Herein the real world article means something that may exists, will exists or already exists in real world and the term "real world article" covers a single piece, a sub-assembly, an assembly, a structure, a connection, like a weld, etc. Depending on an implementation, the change time may indicate either the last time a piece in the object data was changed or the last time an object definition was changed. Thus, the change time indicates the last time information that may affect to the grouping operation may have changed.

The mapping information 11-2 comprises for each object that has been assigned to a group a link and a grouping time. The link associates the object with the group by means of corresponding identifiers, for example. The grouping time indicates the time when the object was assigned to the group or the assignment to the group updated. The mapping information 11-2 may also comprise information indicating whether or not the link is up-to-date.

The group data 11-3 comprises for each group a group identifier and information generated and/or assigned to the group during a group operation, the information being called herein group definitions. A group definition defines one or more features, a feature being shared by all group members (i.e. objects assigned to the group) and generated by the grouping unit and/or given by means of user input to the group and/or obtained from a definition of an object assigned to the group. Thinking of the numbering as a group operation, the group data comprises as group definitions the label to be used, and possible additional data. The label may comprise a preliminary group identifier or some (like a part/piece) of it. The preliminary group identifier is a user created grouping indicator, such as a column in a first floor, or a column to be erected at a certain time. It should be appreciated that the label is a general term and different modeling applications have their own names for the label. For example, Tekla® Structures calls the label a position mark, SDS/2 calls the label a piecemark, Strucad calls the label a mark, and Bocad® uses a term "nummer" (number). Another example of a group operation relates to maintenance, wherein a group data may comprise information on when to perform a maintenance action and what the maintenance action include. For example, if articles are power transmission line supports, their object definitions may comprise like the age, year it has been last time checked, material, quality of substance used against aging, etc. The grouping operation may use one or more of the object definitions to divide the power transmission line supports into maintenance groups, like to a group for which a further visual check needs to be done within a year, which are to be changed to new ones within 3 months, and which are to be repaired within 4 months, etc.

For those objects that have not yet been assigned to a group, a mock group concept may be used. The mock group concept may be implemented in several ways. For example, a mock group may be created for each preliminary group identifier, in which case the mock group is associated with object identifiers of objects having the same preliminary group identifier. Another example is to have one mock group with which each object that has not yet been assigned to the group, is associated with, the mock group having as group information an indication that this is a mock group. Yet a further example is to have a mock group comprising information on each object that has not yet been assigned to the group, the information being associated with a corresponding preliminary group identifier, if such identifiers are used.

If the mock group concept is not utilized, initial mapping information may be created for each object when object data is created. Hence, the mapping information 11-2 may also comprise the preliminary group identifier, at least as long as the object has not yet been assigned to a group. The initial mapping information preferably comprises the object identifier and the preliminary group identifier but neither a grouping time nor a group identifier. In such an implementation, when the object undergoes the grouping operation, the preliminary group information is preferably deleted, or if a new group is created, transferred to be part of the group definitions.

It should be appreciated that in another implementation the object data 11-1 contains also the mapping information. For example, the group identifier and the grouping time may be included in the object data 11-1 thereby forming a link therein and indicating assignment to a group. In a further implementation, the mapping information is included in the group data 11-3, for example by listing object identifiers assigned to the group with corresponding grouping times.

In the example, the data are stored to the data storage in the file and during processing the data constitute a "run-time database" in a central memory of the computing apparatus where they are read from a disk memory and where they can be processed faster. When the processing ends, the run-time data of the database, or at least the changed data, are stored to the disk memory. It is obvious to a person skilled in the art that data can be stored to one or more files and/or they can be stored/processed in another form and/or by using other memories. Further, instead of, or in addition to the above described disk memory, an object-oriented database or a relation database, for example, may be utilized. In a multi-user case, the data may be stored and processed locally in an offline or online mode, and storing the data to the shared memory to be visible to other users is called publishing.

The apparatus 110 comprises the grouping unit 12 for performing functionalities from different embodiments described below. The grouping unit 12 may be a separate unit or integrated to another unit in the apparatus. In another embodiment of the invention, the grouping 12 may be divided into separate units, for example, one unit for performing the actual grouping operation and one unit for determining whether a link is up-to-date and one unit for managing group identifiers and group definitions.

An apparatus implementing functionality or some functionality according to an embodiment may generally include a processor (not shown in FIG. 1), controller, control unit, micro-controller, or the like connected to a memory and to various interfaces of the apparatus. Generally the processor is a central processing unit, but the processor may be an additional operation processor. The grouping unit 12 may be configured as a computer or a processor, or a microprocessor, such as a single-chip computer element, or as a chipset, including at least a memory for providing storage area used for arithmetic operation and an operation processor for executing the arithmetic operation. The grouping unit 12 may comprise one or more computer processors, application-specific integrated circuits (ASIC), digital signal processors (DSP), digital signal processing devices (DSPD), programmable logic devices (PLD), field-programmable gate arrays (FPGA), and/or other hardware components that have been programmed in such a way to carry out one or more functions of one or more embodiments. An embodiment provides a computer program embodied on any client-readable distribution/data storage medium or memory unit(s) or article(s) of manufacture, comprising program instructions executable by one or more processors/computers, which instructions, when loaded into an apparatus, constitute the editing unit and/or the transaction manager unit. Programs, also called program products, including software routines, program snippets constituting "program libraries", applets and macros, can be stored to any medium, and may be downloaded into an apparatus. The data storage medium or the memory unit may be implemented within the processor/computer or external to the processor/computer, in which case it can be communicatively coupled to the processor/computer via various means as is known in the art. In other words, the grouping unit 12 may be an element that comprises one or more arithmetic logic units, a number of special registers and control circuits.

Further, the apparatus may comprise other units, and it comprises different interface units, such as a user interface (not illustrated in FIG. 1) for the user to create a model, change a model, study it, check the group definitions, or at least those parts that are shown to the user, such as the labels, output desired drawings and reports of the model, view the drawings beforehand, input information to the model, etc. The apparatus may also comprise one or more receiving units and/or transmitting units (including a transmitter and/or a receiver or a corresponding means for receiving and/or transmitting information) so that user data, shared data, content, control information, signaling and/or messages can be received and/or transmitted. Yet other examples of units that the apparatus may comprise include an editing unit configured to manage different changes and/or updates to the model, and a transaction manager unit configured to obtain other users' publications/updates to the shared data and maintain dualistic sequence information, and to publish data (the whole data or change information on the data or update information, etc.). The dualistic sequence information is described in more detail below.

The apparatus may generally include volatile and/or non-volatile memory that may be configured to be the data storage. The memory may also store computer program code such as software applications (for example, for the grouping unit 12) or operating systems, information, data, content, or the like for the processor to perform steps associated with operation of the apparatus in accordance with embodiments. The memory may be, for example, EEPROM, ROM, PROM, RAM, DRAM, SRAM, SSD, firmware, programmable logic, a hard drive, or other fixed data memory or storage device etc., and typically store content, data, or the like. Further, the memory, or part of it, may be removable memory detachably connected to the apparatus.

It should be appreciated that the apparatus may comprise other units used in or for modeling. However, they are irrelevant to the actual invention and, therefore, they need not to be discussed in more detail here.

Although the apparatus has been depicted as one unity, different units and memory may be implemented in one or more physical or logical units. Different embodiments of such an apparatus, or more precisely, different examples of a functionality of the grouping unit 12 are described in more detail below.

The modeling system illustrated in FIG. 1 represents a rather simple modeling system. In other modeling systems, the server may be configured to perform one or more of functionalities of the grouping unit 12, or at least some of them, allowing also the apparatus to carry out functions of the grouping unit 12. There may be one or several networks between the apparatus and the server. They may comprise several apparatuses and servers with databases, which are preferably integrated, to be visible to the user as one database and one database server. Whether the functions to be described below are performed in a single computing apparatus, in the server or so that some of them are performed in the apparatus and some in the server, i.e. the location where functions of the grouping unit 12 is performed, is irrelevant to the invention.

Figure 2:
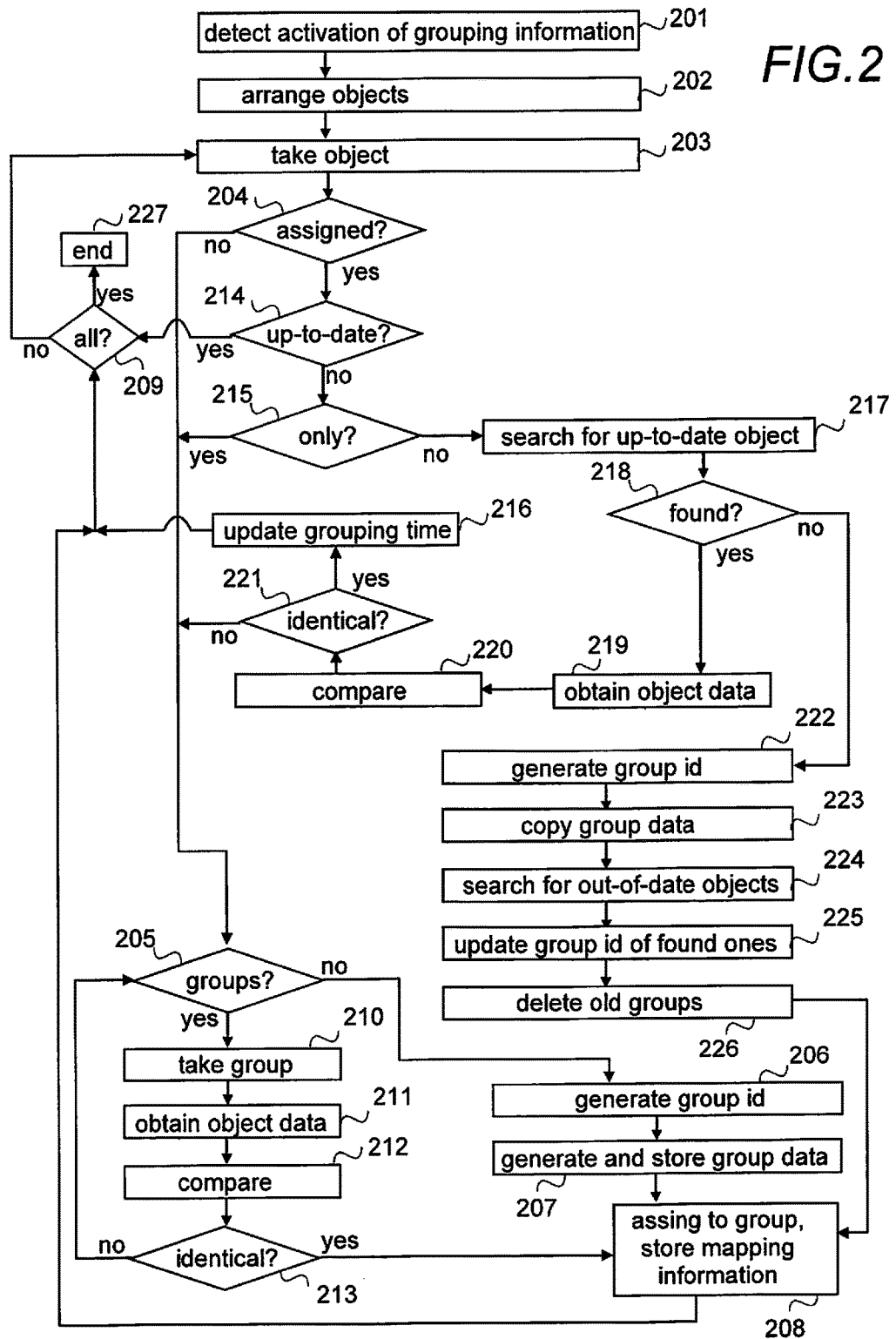

FIG. 2 is a flow chart illustrating functionality of the grouping unit when a grouping operation is performed. In the illustrated example the grouping operation is performed as a specific task in response to a specific request, for example, and not as a real-time background operation. An advantage is that the grouping operation may be postponed to a moment in which the result of the grouping operation is needed, thereby avoiding waste of computing resources. However, it should be appreciated that the grouping operation may be performed as a real-time background operation or as a background operation when reading in new data, or a cloud service may perform the grouping operation when new data is stored to a cloud, for example.

Herein, a grouping operation means that at least the following principles are used: a group comprises only similar objects each of them being replaceable with any other object assigned to the same group; the similar objects need not be grouped to one group, there may be one, two or more groups comprising similar objects; and an object belongs only to one group.

The replaceability (similarity) may be defined by defining one or more object definitions or other comparable information in the object data that has to have the same or equal value in order for the objects to be replaceable (similar), i.e. that they can belong to the same group. Herein, an equal value means that a set of values have been defined to be interpreted as the same although they are not exactly the same. For example, values "a", "b" and "c" may be determined as equal values, and therefore object 1 having value "a" is replaceable with object 2 having value "c" but not with object 3 having value "d". Further, the term "the same" covers herein also equal. The replaceability may be different for different purposes. For example, the replaceability in a construction site may be different than a replaceability for transportation, and hence the same model may undergo separate grouping operations for each different purpose. Another example is that replaceability for determining when a maintenance action is to be made (e.g. a grouping operation groups according to the time) may be different than a replaceability for the actual maintenance action (e.g. a grouping operation groups according to an action). To summ up, "replaceable" equals with similar, similar enough, usable instead of and identical within the context of the grouping. For example, identical within the context of the grouping may mean identical color, identical shape, etc.

Each separate grouping operation is preferably performed as if it were the only grouping operation, and mapping information and group data are maintained grouping operation purpose-specifically.

The grouping operation may be performed for all objects, or for user selected set of objects, and/or for pre-grouped objects, when the grouping operation is triggered and the amount of objects is one or more. A pre-grouped object is an object which has been indicated by the user, for example, to belong to a certain main group, like columns in a first floor. Thus, the preliminary group identifier may be used as a pre-group indicator, if the used modeling application supports preliminary group identifiers and the user provides them. However, use and support of preliminary group identifiers are not necessary, the grouping unit may be configured to perform the whole grouping operation.

For the sake of clarity, in the following examples it is assumed that each object that undergoes the grouping operation represents a real world article and that the replaceability is determined by means of object definitions covering any comparable information defined to be used to determine the replaceability.

Referring to FIG. 2, when activation of the grouping operation for one or more objects is detected in step 201, the objects are arranged in step 202 to a processing order. The processing order used in this example is that objects that have been already assigned to a group are processed before objects not yet assigned to a group. The arranging may be performed by means of the mapping information. It should be appreciated that the order may be a different one or the arranging step 202 may be skipped as well. Thus, the objects may be processed even in a random order. However, in the example, after the objects are in arranged to the processing order, an object is taken in step 203 to be processed. In step 204 it is checked, whether or not the object has been assigned to a group. This checking is performed by utilizing the mapping information. Depending on implementation, no mapping information or a missing link or a missing grouping time or a group identifier having an inappropriate format, like the preliminary group identifier, indicates that the object is not assigned to a group.

If the object is not assigned to a group it is checked in step 205, whether or not one or more groups exist. Depending on implementation, in modeling applications supporting preliminary group identifiers, the checking may or may not include checking that the group data (group definitions) contain the same preliminary group identifier as the object, and only if they are the same, interpreting a group as an existing one. In any case, an existing group has a group identifier and group definitions and at least one object has been assigned to the group, i.e. a mock group is not interpreted to be an existing group in step 205. If there are no existing groups (step 205), a group identifier is generated in step 206 and the group data, including group definitions, are generated and stored in step 207.

There are no requirements how a group identifier and other group data are generated. In one implementation, the group identifier is given by means of globally unique identifiers (GUIDs). GUID is a special type of identifier used in software applications to provide a unique reference number or reference time. The group definitions as well as other group data may be generated according to one or more predefined rule. For example, the group definition may be a label unique for this group, comprising part of the preliminary group identifier (or other pre-group information) and a further indication, like c1 or c/1, c coming from the preliminary group identifier, / illustrating a separator that may be between the two parts, and 1 being the further indication generated or otherwise assigned by the grouping unit. Another exemplary rule is that a label may not be reused, in which case track of the used labels needs to be maintained. In such a case, if a label contains a running number, for example the further indication is a running number, it suffices that information on the largest number used is maintained. An exemplary "counter-rule" is that a label may be reused, if it is orphaned (i.e. no object is assigned to the group.) However, it should be appreciated that there are no limitations how the group definitions, or other group data, are created and what they include. Naturally, if there are some standards and/or national regulations defining what a label, for example, has to comprise, they have to be taken into account.

Then in step 208 the object is assigned to the group and the mapping information including the grouping time is stored. After that it is checked in step 209 whether the grouping operation is performed to all objects. If not, the process proceeds to step 203 where an unprocessed object is taken.

If the object is not assigned to a group and there are one or more groups (step 205), a group is taken in step 210, and object data, or at least the object definitions for determining replaceability, of an object assigned to the group are obtained in step 211. The obtaining utilizes the link in the mapping information. The obtained object definitions for determining replaceability are compared in step 212 with the corresponding object definitions of the object that is processed. If the compared object definitions are identical (step 213), the objects are replaceable with each other, and the process proceeds to step 208 to assign the object to the group and store mapping information.

If the object definitions for determining replaceability are not identical (step 213), the process proceeds to step 205 to check whether or not there exists one or more unprocessed groups. An existing unprocessed group means a group whose object definitions (or more precisely, object definitions of an object assigned to the group) are not yet compared with the object definitions of the object under process. If yes, the process continues to step 210 to take a group to be processed. If no unprocessed groups exist, the process continues to step 206 to create a new group.

If the object is assigned to a group (step 204) it is checked in step 214, whether or not the grouping is up-to-date for the object in question. In an implementation, the mapping information contains information indicating whether it, and hence the link, is up-to-date or out-of-date for the object in question. In another implementation the grouping time is compared with the change time, and if the change time is later than the grouping time, the link is interpreted/determined to be out-of-date. A link interpreted/determined to be out-of-date means that the grouping has to be checked.

If the link is up-to-date, the process proceeds to step 209 to check, whether all objects are processed.

If the link is out-of-date, i.e. not up-to-date (step 214), it is checked in step 215, whether or not the object is the only member in the group. This may be performed by going through the mapping information of all objects. If the group contains only the object, the process proceeds to step 205 to check, whether or not there exist one or more unprocessed groups. It should be appreciated that each time when a new object is taken to be processed all groups are interpreted to be unprocessed groups. If yes, the process continues to step 210 to take a group to be processed, i.e. tries to find a proper group for the object. If no unprocessed groups exist, the process continues to step 206 to create a new group. In an implementation, the old group is always deleted and if a new group is to be created, it will have the same group definitions but a different group identifier, and the mapping information is updated correspondingly. This ensures in the shared data environment that there will not be a group having not replaceable objects.

If the group contains one or more other objects (step 215), an object having an up-to-date link is searched for in step 217. If found (step 218), object data, or at least the object definitions for defining the replaceability, of the found object are obtained in step 219. The obtained object definitions for defining replaceability are compared in step 220 with the corresponding object definitions of the object that is being processed. If the object definitions are identical (step 221), the process proceeds to step 216 to update the grouping time of the object that is processed, and then to step 209 to check, whether or not all objects are processed.

If the object definitions are not identical (step 221), the process proceeds to step 205 to check unprocessed groups. Thus, a suitable group for the object is searched for amongst existing groups before creating a new group.

If the group has no objects with an up-to-date link (step 218), a new group identifier is generated in step 222, the group data of the old group is copied in step 223 to be group data of the new group, and all out-of-date objects assigned to the same group are searched for in step 224. The mapping information of each object found in step 224 is updated in step 225 so that the group identifier is replaced with the new group identifier (without updating the grouping time). Thus, the objects remain out-of-date but when they in turn are processed they will be eventually kept in the same group if they have remained similar. Then the old group is deleted in step 226, and the process proceeds to step 208 to assign the object under process to the new group and store mapping information. By means of deleting the old group (instead of maintaining it for changed similar objects), it is ensured that there will not be different kind of objects in the same group when shared data is used. For example, if there is a group "first floor columns" having objects 1 to 3, the objects being concrete columns with a square cross section, the user has changed the square cross section of objects 1 to 3 to a rectangle cross section, and another user has added an object 4 to the group "first floor columns", the object 4 having a square cross section, thanks to the deletion of step 226 and creation of a new group, the changed objects 1 to 3 do not belong to the old group. Thus, a group having not replaceable objects is avoided. In other words, if a user has added an object to the old group and another user has changed all the objects in the group to be different, these different kinds of objects will never end up in the same group, When all objects are processed (step 209), the process ends in step 227. Then the data may be stored to the data repository and/or up-to-date labels shown to the user, for example.

Figure 3:
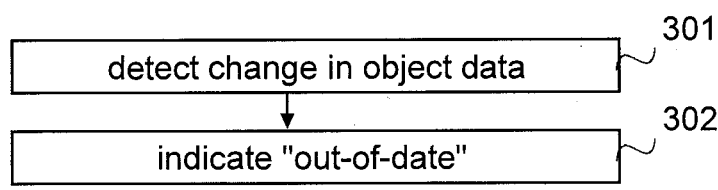
FIGS. 2 to 5 are flow charts illustrating different exemplary functionalities.

FIG. 3 illustrates functionality of the grouping unit in an embodiment, in which the grouping unit indicates object-specifically labels in real-time either out-of-date or up-to-date. For example, an out-of-date label may have a question mark after the label, an up-to-date label is a mere label. Thus, the exemplary functionality is performed as a real-time background operation.

Referring to FIG. 3, the background process monitors the modeling, and when it detects a change in object data in step 301, it indicates in step 302 that the link may be out-of-date.

Figure 4:
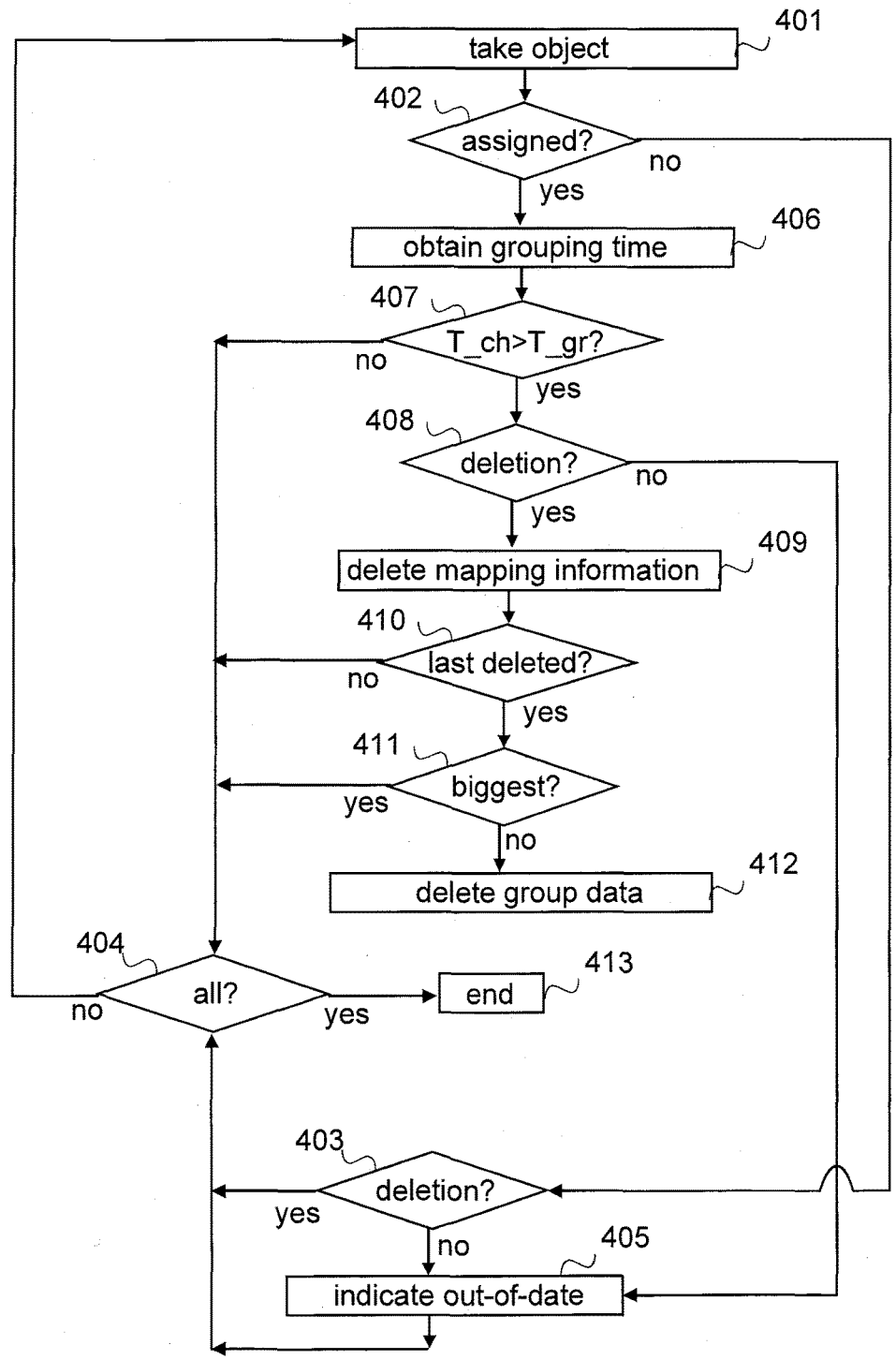

FIG. 4 illustrates a functionality of the grouping unit in an embodiment in which correctness (out-of-date or up-to-date) of the links is not determined in real-time but in certain intervals or in response to a specific request or operation, like in response to triggering the grouping operation or in response to a user wanting to check out whether or not all grouping is up-to-date. In the latter case, the functionality described herein may be performed before the functionality described in FIG. 2 is performed, one result being that the group deletions are performed before the grouping operation. Further, in the embodiment it is assumed that reusing of the group identifiers is not allowed and group identifiers are generated as running numbers. The grouping unit may keep a separate track of the biggest generated group identifier, or it may be determined from the group data or mapping information. It should be appreciated that similar steps may be used for labels and/or the further indications generated by the grouping unit if reuse of the labels and/or the further information is not allowed.

In step 401, an object is taken to be processed. If the object has not yet been assigned to a group (step 402), it is checked, in step 403, whether or not the change is a deletion of the object. If the object was deleted, there is no need to assign it to a group, and the process proceeds to step 404 to check whether or not all objects are processed. If there are unprocessed objects, the process continues to step 401.

If the not-assigned object was not deleted (step 403), the object is associated in step 405 with information indicating that the link may be out-of-date. Thus, the out-of-date indication may also be used to indicate objects that have no group. Then the process proceeds to step 404 to check whether or not all objects are processed.

If the object has been assigned to a group (step 402), the grouping time T_gr and the change time T_ch of the object are obtained in step 406 and compared in step 407. If the change time is not later than the grouping time (step 407), there is no need to change the up-to-date indication and the process proceeds to step 404 to check whether or not all objects are processed.

If the change time is later than the grouping time (step 407), it is checked, in step 408, whether or not the change is a deletion of the object. If not, the object is otherwise changed and the process proceeds to step 405 to indicate that the link may be out-of-date.

If the object has been deleted (step 408) the mapping information of the deleted object, i.e. the object that is processed, is deleted in step 409, and it is checked in step 410, whether the deleted object was the last or only one in the group it was assigned to. If the deleted object was the last or only one in the group it was assigned to (step 410), it is checked, in step 411, whether or not the group identifier is the biggest generated group identifier. If not, the group data of the group the deleted object was assigned to is deleted in step 412. An advantage provided by deleting the group data is that at the same time the number of orphaned groups is minimized and a kind of garbage collection and cleaning is performed. Then the process proceeds to step 404 to check whether or not all objects are processed.

If the group identifier is the biggest (step 411), the process proceeds to step 404 to check whether or not all objects are processed. Hence, the orphaned group data is maintained for this one group.

If there are other objects assigned to the group (step 410), the process proceeds to step 404 to check whether or not all objects are processed.

When all objects are processed (step 404), the process ends in step 413. The outcome may then be shown to the user so that the user can easily see, whether the grouping of the objects the user is interested in, is up-to-date.

Figure 5:
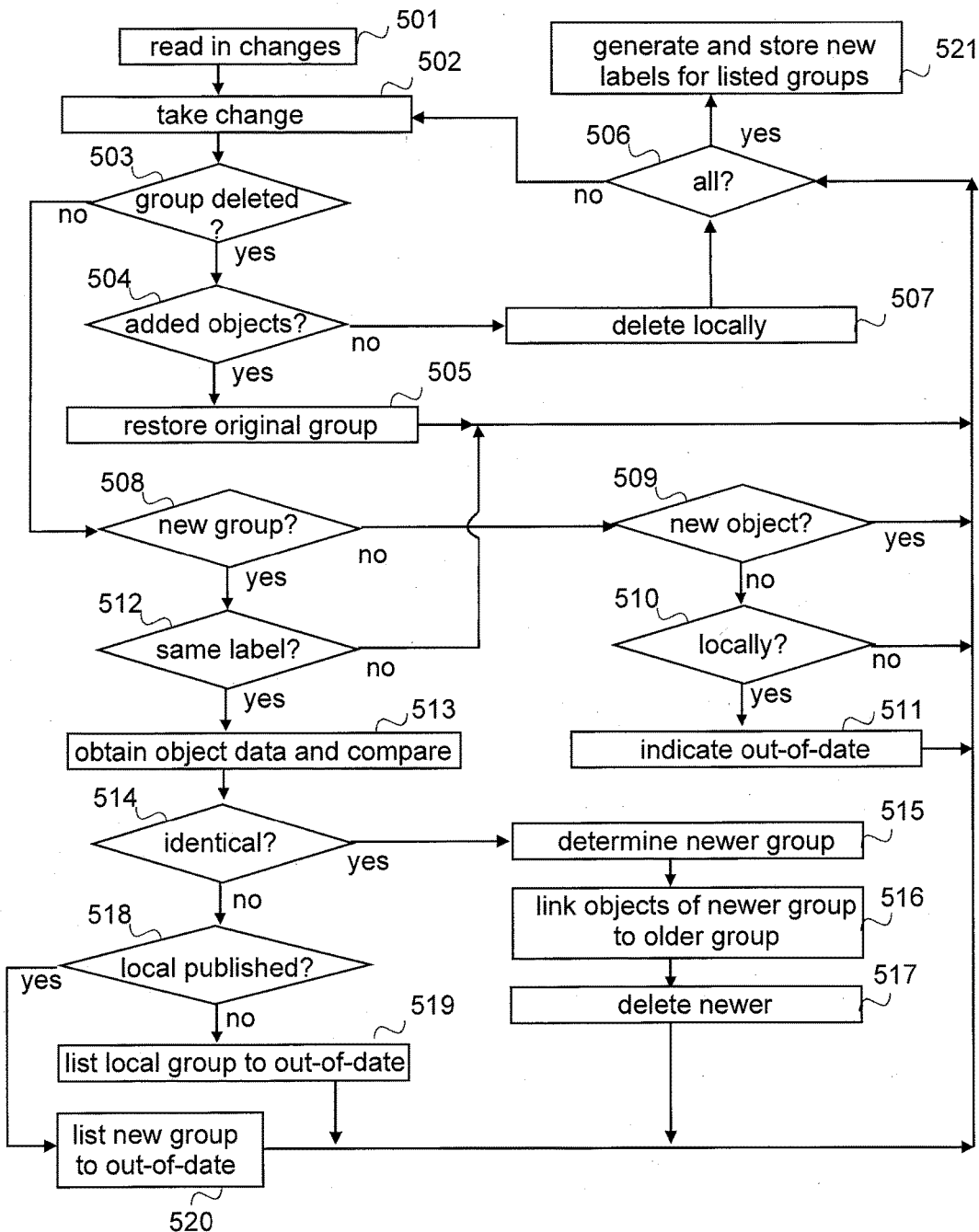

FIG. 5 illustrates functionality of the apparatus, or more precisely the grouping unit in an embodiment providing offline use of shared data to which only changes are published (stored), the embodiment using a principle of causality and dualistic sequence information. It should be appreciated that the dualistic sequence information, with or without the causality principle, may be used with functionalities described with FIGS. 2 and 4, too. For example, the dualistic sequence information may be used to determine whether or not a link is up-to-date. Further, in the illustrated example labels are reusable and a rule that a group published earlier will be maintained is followed without restricting the embodiment or the invention to such a solution. Thus, if any changes to the group definitions are to be performed because of a conflict situation (like different objects having the same label), the group definitions of the later published or not yet published newer group are updated.

The principle of causality is the relationship between a cause and an effect, where the effect is a consequence of the cause and happens after the cause. Herein, a change in object data is a cause and the link (group assignment) is the effect. The dualistic sequence information includes an unambiguous sequence (order) and information indicating a possible internal (local) deviation to the unambiguous sequence, and it is also stored to the shared data. In other words, the dualistic sequence information comprises one or more sequence-pairs (order-pairs). The unambiguous sequence indicates storing (publishing) order in the shared memory, i.e. is a global sequence for the shared data in the shared memory. The dualistic sequence, created with creating, editing, updating etc. of the model locally, indicates that there may be a local deviation from global sequence by means of the deviation information, and therefore the deviation is detectable later. In the concept, if during processing of local copy of the shared data, a change to the shared data is published by another user, a local deviation is created, and when the result of the processing (i.e. unpublished changes) is published, it is associated with an unambiguous sequence reference and the local deviation. In other words, the deviation information is created by the modeling application running in a user A's apparatus, if a user B publishes to the shared model data a change 1 to the model, for example, after a user A has retrieved model data from the shared memory and made change 2 to the model, but the change 2 has not been published before change 1 is read in by the user A's apparatus. Locally, in the user A' apparatus, change 1 is newer compared to change 2, but in the shared data change 1 is older compared to change 2. When the change 2 is published with the dualistic sequence, the above described deviation is detectable later to all users, and a proper sequence for causality is maintained. The principle of causality and the dualistic sequence information are described in more detail in a US patent application publication No. 2012/0239886 A1 claiming priority from a Finnish patent application 20115269 and a corresponding US provisional application 61/466,171, all assigned to the applicant, which are hereby incorporated by reference. Further, the principle of causality and the dualistic sequence information are also implemented in Tekla® Structures release 17.1, released in October 2011.

Referring to FIG. 5, changes to the model data are read in step 501 from the shared memory, i.e. from the data repository in the server. While the published intermediate (i.e. between two consecutive read in steps) changes are read in, or after they are read in, a change is taken in step 502 to be processed and the type of the change is determined (by steps 503, 508, 509). If the change is that a group is deleted (step 503), it is checked in step 504, whether the user has added one or more objects to the group locally (i.e. the added objects are not published). If there is at least one locally added object, the original group is restored in step 505 since the group is not empty. By restoring the group it is ensured that the group will be restored in other apparatuses where it may already have been deleted. Then the process proceeds to step 506 to check, whether all read-in changes are processed. If not, another change is taken to be processed in step 502.

If no objects are added (step 504) by the user to the deleted group, the group is also locally deleted in step 507. By this it is ensured that the user is not adding later members to the group. This local deletion will be in the future published changes, but the next apparatus reading in changes will ignore the latter deletion, there is no conflict if a deleted group is deleted.

If the change is that a new group is added (step 508), it is checked (step 512) whether the same label is found in the local copy. If the same label is found, object data, or at least object definitions for determining of replaceability, of one object belonging to the group in the local copy and object data, or at least corresponding object definitions, of one object belonging to the new group are obtained and compared in step 513. If they are identical (step 514) the groups may be merged. To determine which one of the groups is to be merged to the other one, the group that is newer, i.e. published first time later, is determined in step 515. Then the objects in the newer group are assigned to the other, older group in step 516 by updating the link in the mapping information and updating the grouping time to correspond this updating time. After that the newer group with its group definitions is deleted in step 517. Then the process proceeds to step 506 to check, whether all read-in changes are processed.

If the objects in different groups having the same label are not identical (step 514) it is checked (step 518), to determine which one of the groups is to be listed as out-of-date group, whether or not the local group has been published. If the local group has not been published, it is listed in step 519 to be an out-of-date group. If the local group has been published, the new group is listed in step 520 to be an out-of-date group. (In the example it is assumed that one can publish only after data is read in and processed, so the new group read in at this stage is published later.) After the listing, the process proceeds to step 506 to check, whether all read-in changes are processed.

If the change does not relate to a group, it relates to an object, and in step 509 it is checked, whether the change is that a new object has been added. If not, it is checked in step 510, whether the object has been changed also locally after the previous "read in" stage. If the object is changed also locally, the object's link is indicated in step 511 to be out-of-date so that when the grouping operation is next time performed, the group assignment is checked. By means of this indication the grouping operation may be postponed to a point where it is actually needed. Then the process proceeds to step 506 to check, whether all read-in changes are processed. The process proceeds to step 506 also, when the object has not been changed locally change (step 510).

If the change is that a new object is added (step 509), the process proceeds directly to step 506 to check, whether all read-in changes are processed.

If the same label is not found in the local copy (step 512) new group is a new group also for the local copy and no conflict arises. Therefore the process proceeds to step 506 to check, whether all read-in changes are processed.

When all read-in changes are processed, the groups that are in the list of out-of-date groups are updated in step 521 by generating and storing at least new labels for the groups. Depending on an implementation, also other group definitions may be updated. In another embodiment this may be left to the group operation procedure.

Steps 512-520 ensures that there will not be two groups having the same labels, the older group is given priority to maintain its label, and that similar objects that originally belonged to the older group but were assigned to a new group with the same label, are moved back to the older group if they are similar with the objects in the older group. In other words, steps 512-520 provide automatic conflict handling The steps shown in FIGS. 2 to 5 are in no absolute chronological order and some of the steps may be performed simultaneously or in an order different from the given one. Further, the steps and functions in one Figure may be performed in parallel with the steps and functions in another Figure. For example, after step 511 in FIG. 5, the process may proceed to step 204 in FIG. 2. Other functions can also be executed between the steps or within the steps. Some of the steps or part of the steps can also be left out as is already described above. The steps can also be freely combined or divided into several parts. Part of the steps described can also be replaced with a step accomplishing a corresponding end result. For example, to resolve a conflict situation, instead of comparing object data in response to a same label (step 512), it is determined which one of the groups is newer, the objects assigned to the newer group are linked (reassigned) to the older group and indicated as having an out-of-date link, and then the newer group is deleted. When the grouping operation is performed, the assignment will be checked and if the objects are identical, they will end up to be in the same group. Another example is that the decision which one of the groups is the oldest (older) one may be made by using the creation time of the groups, the publication time of the groups, or by comparing a creation time of the oldest object in a group by a creation time of the oldest object in the other group.

Although in the above a time is used to indicate a sequence (a particular order in which events or actions happened), it should be appreciated that any other mean/reference to indicate a sequence can be used, such as an unambiguous storing index.

It will be obvious to a person skilled in the art that, as the technology advances, the inventive concept can be implemented in various ways. The invention and its embodiments are not limited to the examples described above but may vary within the scope of the claims.

What is claimed is:

1. A method comprising:
obtaining, by a computer-aided modeling application, from a shared memory to a local memory, a copy of a model comprising a plurality of objects, each object representing a real-world article and having a unique object identifier, the shared memory comprising the model in a form of shared data;
processing, by the computer-aided modeling application, the copy of the model in the local memory;
performing, by the computer-aided modeling application, a grouping operation in the copy of the model, during which an object included in the model, which has object data that comprises an object identifier and one or more object definitions defining at least one physical property of the object, is assigned to a group having a group identifier and at least one group definition defining at least a label unique to the group within the model and shared by all objects assigned to the group, wherein, after the grouping operation, the model comprises exactly the same one or more objects as before the grouping operation, mapping information and one or more groups, wherein an object in the model is assigned to only one group, and wherein objects assigned to the same group are each replaceable with any other object assigned to the same group, wherein the mapping information comprises both a time of grouping, which indicates the time the grouping operation was performed to the object and a link between the object and the group;

storing the mapping information at least to the copy of the model in the local memory;

reading in changes to the model from the shared memory comprising the model in a form of shared data;

in response to a read-in change being a change to an object that has been assigned to a group and exists also in the local copy, checking whether the object has been changed also locally after a previous read-in, and in response to the object having been changed locally after the previous read-in, updating the link of the object to be out-of-date;

performing, in response to a request for identifying information for a transportation related real-world article, manufacturing related real-world article, or construction site related real-world article, the grouping process to objects having a link indicated as out-of-date and to objects that have not yet undergone the grouping process, and then using the mapping information to retrieve the at least one group definition defining at least the label unique to the group that includes the object;

creating shared identifying information for the related real-world article by adding at least the label to the created shared identifying information; and outputting the created shared identifying information for the transportation, manufacturing or construction site-related real-world article.

2. The method according to claim 1, wherein the grouping operation further comprises:

checking, prior to assigning the object to the group, whether another object is already assigned to the group;

in response to another object already being assigned to the group, the grouping operation further comprises:

obtaining at least one object definition of the other object:

comparing the obtained at least one object definition of the other object with the corresponding at least one object definition of the object that is to be assigned; and in response to the comparison indicating that the objects are replaceable with each other, assigning the object to the group.

3. The method according to claim 2, further comprising, in response to the the comparison indicating that the objects are not replaceable with each other:

searching amongst already existing groups for a suitable group, the searching including repeating the obtaining and comparing group-specifically, a suitable group being a group to which a replaceable object has already been assigned;

in response to a suitable group being found, assigning the object to the suitable group; and otherwise, creating a new group and assigning the object to the new group.

4. The method according to claim 3, wherein the creating of a new group comprises:

generating a group identifier;

defining one or more group definitions including the label by performing at least one of the following functionalities comprising generating one or more group definitions and receiving one or more group definitions as user input; and storing the group identifier and the one or more group definitions to the model in the memory.

5. The method according to claim 2, further comprising:

in response to another object being already assigned to the group, the grouping operation further comprises, before the obtaining and comparing:

comparing the time of grouping of the other object with a change time of the other object indicating a time when one or more of the object definitions of the other object were changed last;

in response to the change having happened later, determining that the link of the other object may be out-of-date and searching for another object assigned to the group and having an up-to-date link; and otherwise, determining that the link is up-to-date, and performing the obtaining and comparing.

6. The method according to claim 1, further comprising:

checking, prior to performing assigning, whether the object has already being assigned to a group;

in response to the object having already been assigned to a group, the method further comprises:

comparing time of grouping of the object with a change time of the object indicating time when one or more of the object definitions were changed last;

in response to the change having happened later, determining that the link may be out-of-date; and otherwise determining that the link is up-to-date.

7. The method according to claim 6, further comprising, in response to the determining that the link may be out-of-date:

determining whether the object is the only object assigned to the group;

in response to a determination that the object is not the only object assigned to the group, searching for another object assigned to the group and having an up-to-date link;

in response to the other object assigned to the group being found, the method further comprises:

obtaining at least one object definition of the other object assigned to the group;

comparing the obtained at least one object definition of the other object assigned to the group with corresponding at least one object definition of the object; and in response to the comparison indicating that the objects are replaceable with each other, updating the time of grouping of the object in the mapping information.

8. The method according to claim 6, further comprising, in response to a change that happened later, prior to determining that the link may be out-of-date:

checking whether the change is a deletion of the object;

in response to the change not being a deletion of the objection, determining that the mapping information may be out-of-date;

in response to the change being the deletion of the object, the method further comprises:

deleting the mapping information stored to the memory for the object;

checking, whether there are any other objects assigned to the group; and in response to there being no other objects assigned to the group, deleting the group.

9. The method according to claim 1, further comprising, in response to a read-in change being a group deletion:
searching for objects assigned to the group in the local copy after a previous time changes were read in; and
restoring the group in response to finding at least one such object.

10. The method according to claim 1, further comprising, in response to a read-in change being a new group:
checking whether there is, in the local copy, a group having one or more same group definitions;
in response to there being a group having one or more same group definitions in the local copy:
determining which one of the groups is newer; and
updating the link in the mapping information of each object assigned to the newer group so that the objects are assigned to the older group after the link update;
indicating that the link may be out of date for each object whose link is updated, and
deleting the newer group.

11. A method according to claim 1, further comprising, in response to a read-in change being a new group:
checking whether there is, in the local copy, a group having one or more same group definitions; and
in response to there being a group having one or more same group definitions in the local copy:
checking whether the group in the local copy has been stored to the shared data; and
in response to the local copy having not been stored to the shared data, updating at least one of the same one or more group definitions of the group in the local copy to be different than a corresponding group definition in the new group.

12. A method according to claim 1, further comprising, in response to a read-in change being a new group:
checking whether there is in the local copy a group having one or more same group definitions;
in response to there being a group having one or more same group definitions in the local copy:
obtaining at least one object definition of an object assigned to the new group and at least one corresponding object definition of another object assigned to the group in the local copy;
comparing the obtained object definitions; and
in response to the comparison indicating that the objects are replaceable with each other:
determining which one of the groups is newer; and
updating the link in the mapping information of each object assigned to the newer group so that the objects are assigned to the older group after the link update.

13. The method according to claim 12, further comprising, in response to the comparison indicating that the objects are not replaceable with each other:
checking whether the group in the local copy has been stored to the shared data; and
in response to the local copy having not been stored to the shared data, updating one or more group definitions of the group in the local copy.

14. The method according to claim 1, further comprising using dualistic sequence information for time comparisons, wherein the dualistic information comprises one or more sequence-pairs, a sequence pair comprising an unambiguous sequence indicating storing order in the memory and comprising the model in a form of shared data and deviation information indicating that there may be a local deviation from the unambiguous sequence.

15. The method as claimed in claim 1, further comprising:
receiving a first part of the label as user input; and
generating a second part of the label when a group is created.

16. A method comprising:
obtaining, by a computer-aided modeling application, from a shared memory to a local memory, a copy of a model comprising a plurality of objects, mapping information and one or more groups, each object representing a real-world article and having a unique object identifier and object data that comprises one or more object definitions defining at least one physical property of the object;
processing, by the computer-aided modeling application, the copy of the model in the local memory;
checking, for an object amongst the plurality of objects, whether the object has already been assigned to a group and has mapping information, the mapping information comprising a time of grouping, which indicates when the object was assigned to the group and a link between the object and the group the object is assigned to;
in response to the object having already been assigned to the group, comparing the time of grouping with a change time of the object, the change time indicating a time when one or more of the object definitions were changed last, and in response to the change having happened later, determining that the link may be out-of-date, otherwise determining that the link is up-to-date;
in response to the object having not yet been assigned to a group:
searching amongst already existing groups for a suitable group, the searching including, for each processed group, obtaining at least one object definition of an object assigned to the processed group and having an up-to-date link, comparing the obtained at least one object definition of the object assigned to the processed group with corresponding at least one object definition of the object that is to be assigned;
in response to the comparison indicating that the objects are replaceable with each other, assigning the object to the processed group, stopping the searching and storing mapping information that comprises both the time of grouping and the link;
in response to no suitable group being found, creating a new group, assigning the object to the new group, storing mapping information that comprises both the grouping time and the link and storing for the new group at least a group identifier and one group definition defining at least one feature relating to maintenance of real-world articles and being shared by all objects assigned to the group;
storing, to the existing mapping information of the model in the memory, the mapping information created during the grouping operation;
reading in changes to the model from the shared memory comprising the model in a form of shared data;
in response to a read-in change being a change to an object that has been assigned to a group and exists also in the local copy, checking whether the object has been changed also locally after a previous read-in, and in response to the object having been changed locally after the previous read-in, updating the link of the object to be out-of-date;

performing, in response to a maintenance action being selected for planning maintenance actions of real-world articles, the grouping process to objects having a link indicated as out-of-date and to objects that have not yet undergone the grouping process, and then:
determining one or more groups that have in their at least one group definition at least one feature relating to the maintenance action;
using the mapping information of the determined one or more groups to determine objects belonging to the one or more groups; and
outputting the determined objects to plan the maintenance action of the corresponding real-world articles.

17. An apparatus comprising:
at least one processor, and
at least one memory including computer program code, the at least one memory and the computer program code being configured to, with the at least one processor, cause the apparatus at least to
obtain from a shared memory a stored model comprising a plurality of objects, each object representing a real-world article and having a unique object identifier;
process a local copy of the model;
perform a grouping operation on the model, during which object data that comprises one or more object definitions defining at least one physical property of the object, is assigned to a group having a group identifier and at least one group definition defining at least one feature shared by objects assigned to the group, wherein after the grouping operation the model comprises exactly the same plurality of objects as prior to the grouping operation, mapping information and one or more groups, wherein an object is assigned to only one group, and objects assigned to the same group are each replaceable with any other object assigned to the same group, wherein, when the grouping operation is performed for transportation, manufacturing or a construction site related real-world article, a feature shared by objects assigned to the group is a label that is a piece of identifying information shared by objects assigned to the same group, and wherein, when the grouping operation is performed for maintenance, a feature shared by objects assigned to the group relates to a maintenance action;
store, to the one of the at least one memory, mapping information that comprises both a time of grouping, which indicates the time the grouping operation was performed to the object, and a link between the object and the group;
read in changes to the model from the shared memory comprising the model in a form of shared data;
check, in response to a read-in change being a change to an object that has been assigned to a group and exists also in the local copy, whether the object has been changed also in the local copy after a previous read-in, and in response to the object having been changed in the local copy after the previous read-in, update the link of the object to be out-of-date;
perform, in response to one of a request for shared identifying information for a transportation, manufacturing, or construction site related real-world article and a maintenance action being selected for planning maintenance actions of real-world articles, the grouping process to objects having a link indicated as out-of-date and to objects that have not yet undergone the grouping process;
create shared identifying information in response to the request for shared identifying information for a transportation, manufacturing, or construction site related real-world article, by using the mapping information to retrieve the at least one group definition defining at least the label unique to the group to which the object is assigned;
add the label to the created shared identifying information;
output the created shared identifying information for the transportation, manufacturing or construction site-related real-world article; and
determine, in response to the maintenance action being selected for planning maintenance actions of real-world articles, one or more groups having in their at least one group definition defining at least one feature relating to the maintenance action;
determine objects assigned to the determined one or more groups by using the mapping information; and
output the objects for planning maintenance actions of all real-world articles corresponding to the objects in the group.

18. The apparatus as claimed in claim 17, wherein the at least one memory and the computer program code are configured to, with the at least one processor, further cause the apparatus at least to
check, prior to assigning the object to the group, whether another object is already assigned to the group;
in response to another object being already assigned to the group:
obtain at least one object definition of the other object:
compare the obtained at least one object definition of the other object with corresponding at least one object definition of the object that is to be assigned; and
assigning, in response to the comparison indicating that the objects are replaceable with each other, the object to the group.

19. A non-transitory computer-readable program storage medium with a computer program for data processing, wherein the execution of the program on a computer makes the computer implement the following steps when processing a local copy of a model comprising a plurality of objects, each object representing a real-world article and having a unique object identifier, the model being stored to a shared memory in a form of shared data:
assigning, during a grouping operation, an object, which has a unique object identifier and object data that comprise one or more object definitions defining at least one physical property of the object, to a group having a group identifier and at least one group definition defining at least one feature shared by objects assigned to the group;
storing, at least to the local copy of the model, mapping information that comprises both a time of grouping, which indicates the time the grouping operation was performed on the object, and a link between the object and the group;
reading in changes to the model from the shared memory;
detecting a type of a read-in change;
in response to a read-in change being a change to an object that exists also in the local copy: checking whether the object has been changed also locally after a previous read-in, and in response to the object having been changed locally after the previous read-in, indicating that the link is out-of-date; and using the mapping information to output the at least one group definition to be used with all real-world articles corresponding to the objects assigned to the group,
wherein the using includes performing the assigning at least to objects having links indicated out-of-date to update the links and corresponding group assignments and one of the following:

creating, in response to a request for shared identifying information for a transportation, manufacturing or construction site related real-world article, shared identifying information by retrieving, using the mapping information, the at least one group definition defining at least a label as a piece of identifying information shared by objects assigned to the group, adding the label to the created shared identifying information, and outputting the created shared identifying information for the transportation, manufacturing or construction site related real-world article; and determining, in response to a maintenance action being selected for planning maintenance actions of real-world articles, one or more groups having in their at least one group definition at least one feature relating to the maintenance action, and determining by using the mapping information, objects belonging to the determined one or more groups, and outputting the determined objects for planning maintenance actions of all real-world articles corresponding to the determined objects.

20. A non-transitory computer-readable program storage medium as claimed in claim 19, wherein the execution of the program on a computer makes the computer further implement the following steps:

in response to a read-in change being a new group:
checking whether there is in the local copy a group having one or more same group definitions;
in response to there being a group having one or more same group definitions in the local copy:
determining which one of the groups is newer;
updating the link in mapping information of each object assigned to the newer group so that the objects are assigned to the older group after the link update;
indicating that the link may be out of date for each object whose link is updated, and deleting the newer group; and in response to a read-in change being a group deletion:
searching for objects assigned to the group in the local copy after a previous time changes were read in; and
restoring the group in response to finding at least one such object.

21. The non-transitory computer-readable program storage medium as claimed in claim 20, wherein the execution of the program on a computer makes the computer further use dualistic sequence information for time comparisons, wherein the dualistic information comprises one or more sequence pairs, a sequence pair comprising an unambiguous sequence indicating storing order in the memory comprising the model in a form of shared data and deviation information indicating that there may be a local deviation from the unambiguous sequence.

22. The non-transitory computer-readable program storage medium as claimed in claim 19, wherein the execution of the program on a computer makes the computer further implement the following steps when a local copy of the model is being processed:

in response to a read-in change being a new group:
checking whether there is in the local copy a group having one or more same group definitions;
in response to there being a group having one or more same group definitions in the local copy:
checking whether the group in the local copy has been stored to the shared data; and
in response to the local copy having not been stored to the shared data, updating at least one of the same one or more group definitions of the group in the local copy to be different than a corresponding group definition in the new group; and in response to a read-in change being a group deletion:
searching for objects assigned to the group in the local copy after a previous time changes were read in; and
restoring the group in response to finding at least one such object.

23. The non-transitory computer-readable program storage medium as claimed in claim 22, wherein the execution of the program on a computer makes the computer further use dualistic sequence information for time comparisons, wherein the dualistic information comprises one or more sequence pairs, a sequence pair comprising an unambiguous sequence indicating storing order in the memory comprising the model in a form of shared data and deviation information indicating that there may be a local deviation from the unambiguous sequence.

24. The non-transitory computer-readable program storage medium as claimed in claim 19, wherein the execution of the program on a computer makes the computer further use dualistic sequence information for time comparisons, wherein the dualistic information comprises one or more sequence pairs, a sequence pair comprising an unambiguous sequence indicating storing order in the memory comprising the model in a form of shared data and deviation information indicating that there may be a local deviation from the unambiguous sequence.

* * * * *